(12) United States Patent
Yang et al.

(10) Patent No.: US 10,964,707 B2
(45) Date of Patent: Mar. 30, 2021

(54) SEMICONDUCTOR DEVICE

(71) Applicant: SAMSUNG ELECTRONICS CO., LTD., Suwon-si (KR)

(72) Inventors: Seol Un Yang, Suwon-si (KR); Lak Gyo Jeong, Hwaseong-si (KR); Hee Bum Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 15/985,817

(22) Filed: May 22, 2018

(65) Prior Publication Data

US 2019/0067301 A1 Feb. 28, 2019

(30) Foreign Application Priority Data

Aug. 30, 2017 (KR) .................. 10-2017-0109989

(51) Int. Cl.
*H01L 27/11* (2006.01)
*H01L 27/088* (2006.01)
*H01L 29/78* (2006.01)

(52) U.S. Cl.
CPC ...... *H01L 27/1116* (2013.01); *H01L 27/0886* (2013.01); *H01L 27/1104* (2013.01); *H01L 29/785* (2013.01)

(58) Field of Classification Search
CPC .. H01L 27/11; H01L 27/1104; H01L 27/1116; H01L 21/762; H01L 21/823481; H01L 21/823878

See application file for complete search history.

(56) References Cited

U.S. PATENT DOCUMENTS

| | | | |
|---|---|---|---|
| 5,142,492 A * | 8/1992 | Shimizu | G11C 5/025 365/182 |
| 6,455,904 B1 | 9/2002 | Noda | |
| 7,022,563 B2 | 4/2006 | Ootsuka et al. | |
| 8,582,352 B2 | 11/2013 | Liaw | |
| 9,673,202 B2 | 6/2017 | Liaw | |
| 2005/0044522 A1 * | 2/2005 | Maeda | H01L 27/0207 716/53 |
| 2016/0056081 A1 * | 2/2016 | Baek | H01L 21/823481 438/283 |
| 2016/0190141 A1 * | 6/2016 | Lee | H01L 27/1104 |
| 2016/0240540 A1 * | 8/2016 | Hung | H01L 27/1104 |
| 2016/0372316 A1 * | 12/2016 | Yang | H01L 27/1211 |
| 2017/0040328 A1 | 2/2017 | Park et al. | |
| 2017/0084617 A1 | 3/2017 | Park et al. | |
| 2017/0110182 A1 | 4/2017 | Liaw | |

* cited by examiner

*Primary Examiner* — Kenneth Parker
*Assistant Examiner* — Long H Le
(74) *Attorney, Agent, or Firm* — Lee IP Law, P.C.

(57) ABSTRACT

A semiconductor device includes a substrate with a buffer region between first and second regions, the first region being a SRAM cell region, and the second region being a peripheral circuit region, first gate structures in a first direction on the first region and being spaced apart from each other in a second direction, second gate structures in the first direction on the second region and being spaced apart from each other in the second direction, the first and second gate structures being aligned with each other, a first insulating structure in the second direction on the buffer region between the first and the second regions along an entire length of each of the first and second regions in the second direction, and a second insulating structure on the first region and in contact with a part of the plurality of first gate structures.

14 Claims, 21 Drawing Sheets

SEMICONDUCTOR DEVICE

CROSS-REFERENCE TO RELATED APPLICATION

Korean Patent Application No. 10-2017-0109989, filed on Aug. 30, 2017, in the Korean Intellectual Property Office, and entitled: "Semiconductor Device," is incorporated by reference herein in its entirety.

BACKGROUND

1. Field

Exemplary embodiments of the present disclosure relate to a semiconductor device.

2. Description of the Related Art

Miniaturization of patterns is required to manufacture highly integrated semiconductor elements. In order to integrate many elements within a small area, the size of each element needs to be made as small as possible, and to this end, there is a need to reduce a pitch which is a sum of the width of each pattern to be formed and the interval between patterns. Recently, in accordance with a rapid decrease in the design rule of a semiconductor element, in a photolithography process for forming patterns necessary for implementing the semiconductor element, there is a limit to formation of patterns having a fine pitch due to a resolution limit.

SUMMARY

According to an exemplary embodiment of the present disclosure, there is provided a semiconductor device, including a substrate including a first region, a second region, and a buffer region between the first region and the second region, the first region being a SRAM cell region, and the second region being a first peripheral circuit region to operate the SRAM cell region, a plurality of first gate structures extending long in a first direction on the first region of the substrate, the plurality of first gate structures being spaced apart from each other in a second direction different from the first direction, a plurality of second gate structures extending long in the first direction on the second region of the substrate, the plurality of second gate structures being spaced apart from each other in the second direction, and each one of the plurality of second gate structures being aligned with a corresponding one of the plurality of first gate structures in a row along the first direction, a first insulating structure extending in the second direction on the buffer region of the substrate, the first insulating structure extending between the first region and the second region along an entire length of each of the first and second regions in the second direction, and a second insulating structure on the first region of the substrate, the second insulating structure being in contact with a part of the plurality of first gate structures.

According to an exemplary embodiment of the present disclosure, there is provided a semiconductor device, including a substrate having a first region, a second region, and a buffer region disposed between the first region and the second region, a first gate structure including a first long side extending in a first direction, and a first short side extending in a second direction different from the first direction, on the substrate of the first region, a second gate structure including a second long side extending in the first direction and a second short side extending in the second direction on the substrate of the second region, the second short side facing the first short side, a first insulating structure disposed on the substrate of the buffer region between the first short side of the first gate structure and the second short side of the second gate structure, and a second insulating structure on the substrate of the first region, wherein the first gate structure being disposed between the first insulating structure and the second insulating structure and a width of the first insulating structure in the first direction being different from a width of the second insulating structure in the first direction.

According to an exemplary embodiment of the present disclosure, there is provided a semiconductor device, including a deep trench of a first depth defining a first region and a second region spaced apart from each other, a first trench which defines a first fin type pattern extending in a first direction in the first region and has a second depth shallower than the first depth, a second trench which defines a second fin type pattern extending in the first direction in the second region and has a third depth shallower than the first depth, a field insulating film which fills a part of the deep trench, a part of the first trench, and a part of the second trench, a first insulating structure having a first width in a second direction different from the first direction, on the field insulating film filling the deep trench, a second insulating structure having a second width different from the first width in the second direction, on the field insulating film filling the first trench, a first gate structure intersecting with the first fin type pattern and extending in the second direction between the first insulating structure and the second insulating structure, and a second gate structure extending in the second direction and intersecting with the second fin type pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
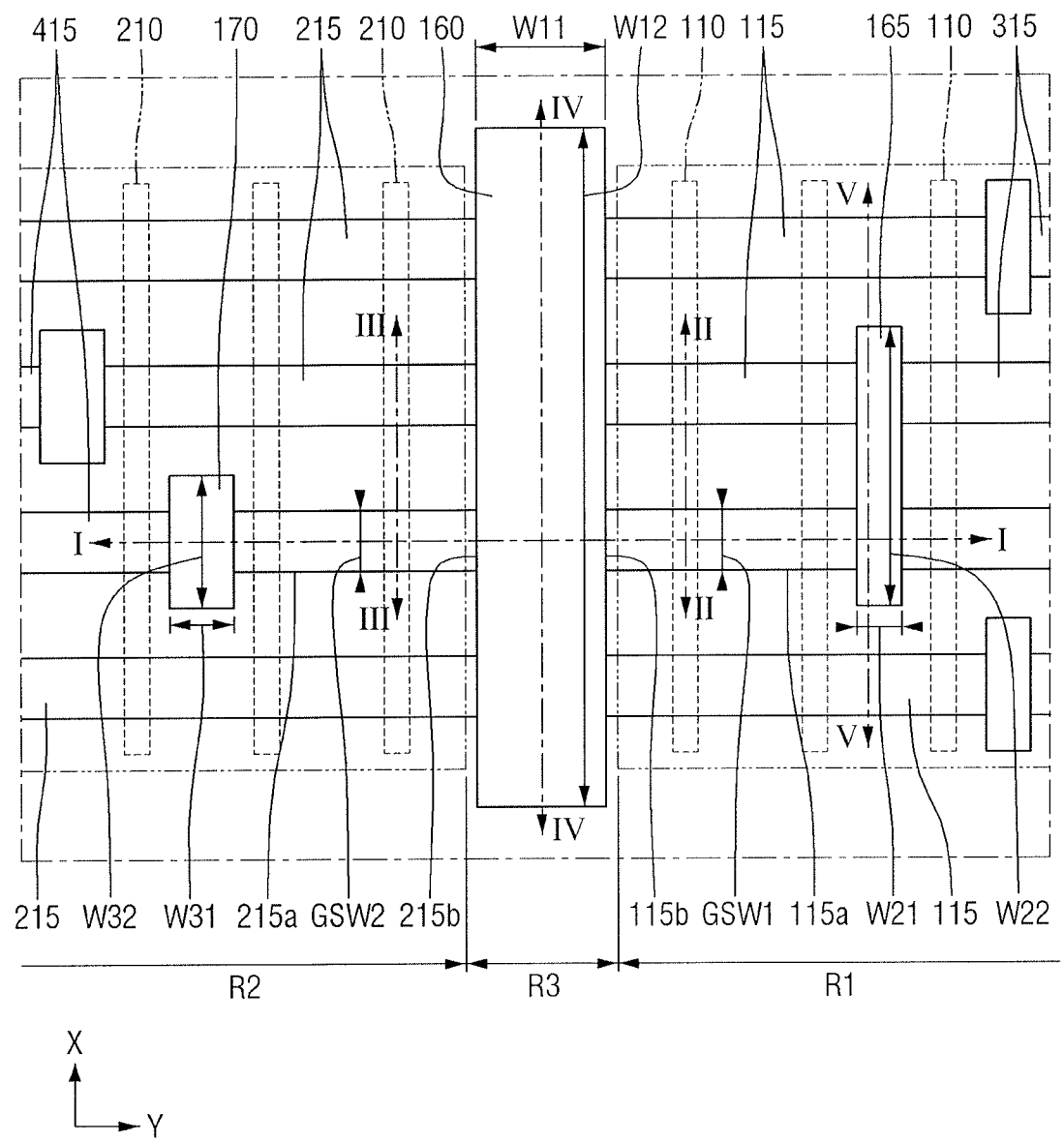
FIG. 1 illustrates a plan view of a semiconductor device according to some exemplary embodiments of the present disclosure.

In the drawings of the semiconductor device according to some exemplary embodiments of the present disclosure, a fin type transistor (FinFET) including a channel region of a fin type pattern shape is illustrated as an example, but the present disclosure is not limited thereto. The semiconductor device according to some exemplary embodiments of the present disclosure may include a tunneling transistor (FET), a transistor including a nanowire, a transistor including a nanosheet, or a three-dimensional (3D) transistor. In addition, the semiconductor device according to some exemplary embodiments of the present disclosure may include a bipolar junction transistor, a lateral double diffused transistor (LD-MOS) or the like. Further, although the semiconductor device according to some exemplary embodiments of the present disclosure is described as being a multi-channel transistor using a fin type pattern, the semiconductor device is not limited thereto, e.g., may be a planar transistor.

Figure 2:
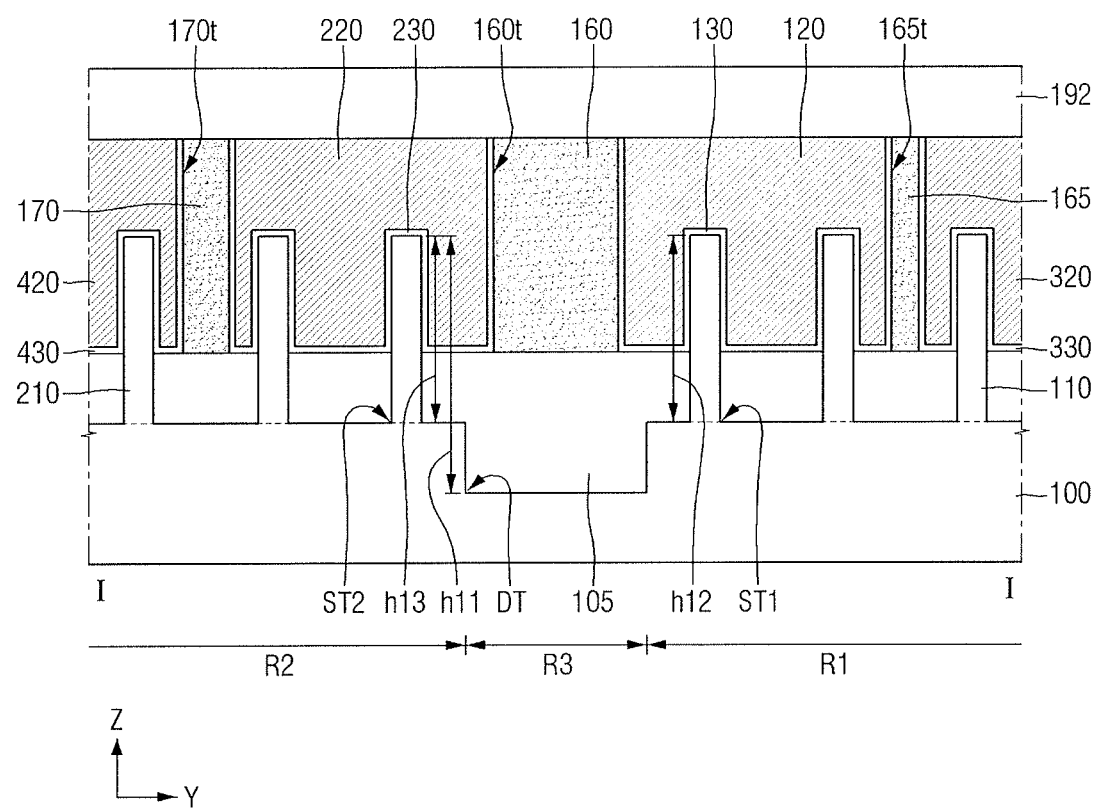
FIG. 2 illustrates a cross-sectional view along line I-I of FIG. 1.
Figure 3A:
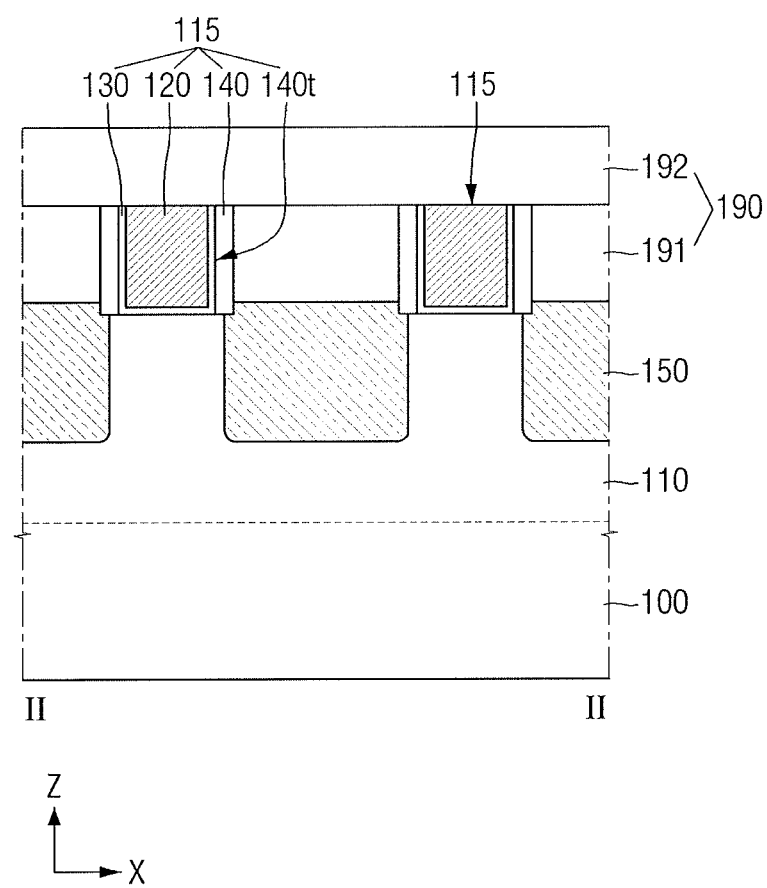
FIG. 3a and FIG. 3b illustrate cross-sectional views along lines II-II and III-III of FIG. 1, respectively.
Figure 3B:
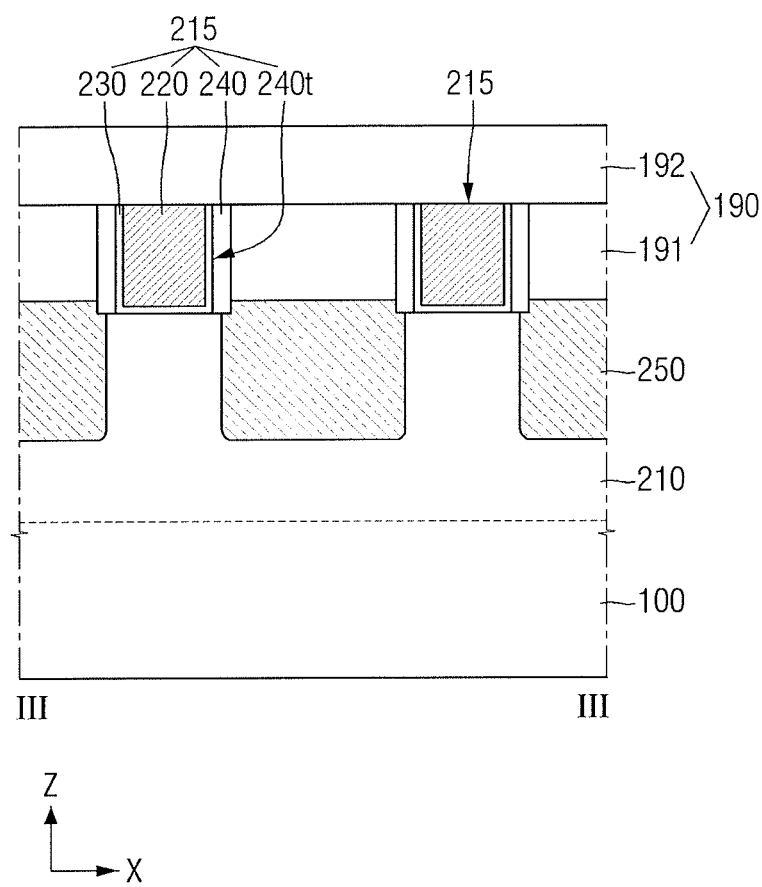
Figure 4:
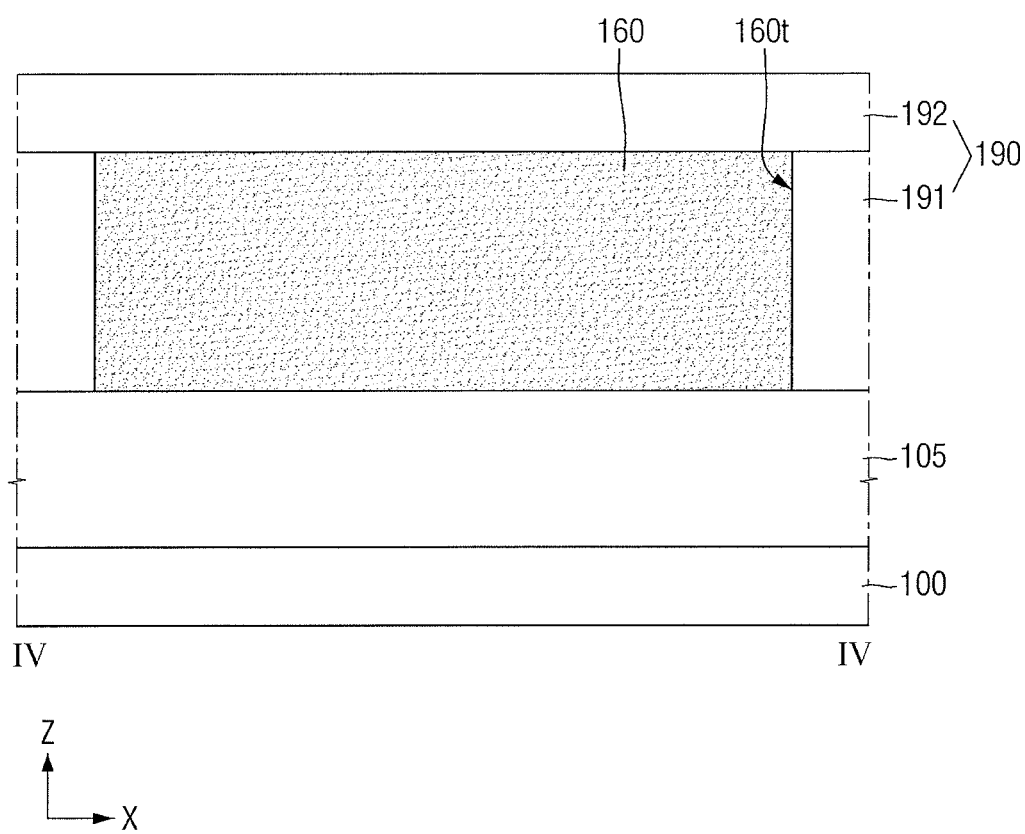
FIG. 4 illustrates a cross-sectional view along line IV-IV of FIG. 1.
Figure 5:
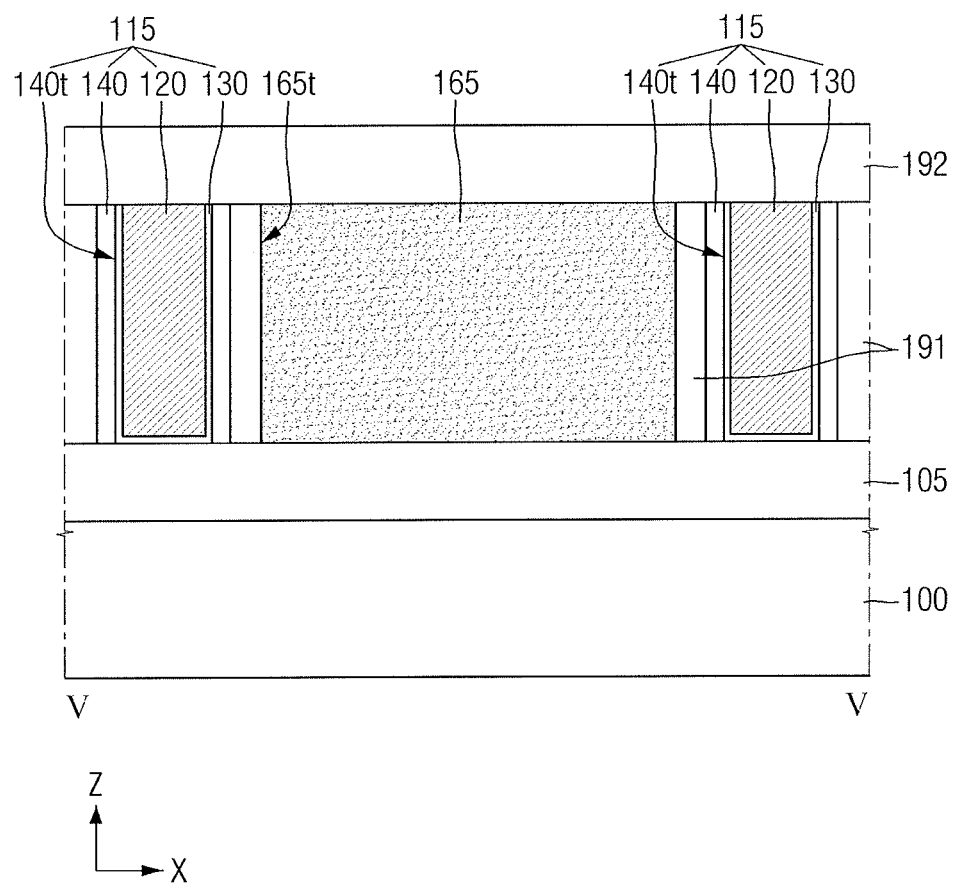
FIG. 5 illustrates a cross-sectional view along line V-V of FIG. 1.

FIG. 1 is a plan view for explaining a semiconductor device according to some exemplary embodiments of the present disclosure. FIG. 2 is a cross-sectional view taken along line I-I of FIG. 1, FIG. 3a and FIG. 3b are cross-sectional views taken along lines II-II and III-III of FIG. 1, respectively, FIG. 4 is a cross-sectional view taken along line IV-IV of FIG. 1, and FIG. 5 is a cross-sectional view along line V-V of FIG. 1. It is noted that for convenience of explanation, a lower interlayer insulating film 191 and an upper interlayer insulating film 192 are not illustrated in FIG. 1.

Referring to FIG. 1 to FIG. 5, a semiconductor device according to some exemplary embodiments of the present disclosure may include a first fin type pattern 110, a second fin type pattern 210, a first gate structure 115, a second gate structure 215, a third gate structure 315, a fourth gate structure 415, a first insulating structure 160, a second insulating structure 165, and a third insulating structure 170 on a substrate 100.

In detail, as illustrated in FIGS. 1-2, the substrate 100 may include first to third regions R1, R2, and R3. The first region R1 and the second region R2 may be spaced apart from each other. The third region R3 may be interposed between the first region R1 and the second region R2. The first region R1 and the second region R2 may be spaced apart from each other in a second direction Y with the third region R3 interposed therebetween.

For example, the substrate 100 may be bulk silicon or silicon-on-insulating structure (SOI). In another example, the substrate 100 may be a silicon substrate, and may contain, but is not limited to, other materials, e.g., silicon germanium, silicon germanium on insulating structure (SGOI), indium antimonide, lead tellurium compound, indium arsenide, phosphide indium, gallium arsenide or gallium antimonide.

In the semiconductor device according to some exemplary embodiments of the present disclosure, the first region R1 may be a cell array region in which a plurality of memory cells for storing data is formed, e.g., a static random access memory (SRAM) cell array region. For example, in the first region R1, a plurality of six transistor (6T) SRAM cells including the six transistors, or 8T SRAM cells including the eight transistors may be formed, but the technical idea of the present disclosure is not limited thereto.

The second region R2 may be a part of a peripheral circuit region in which a peripheral circuit is formed. The peripheral circuit formed in the second region R2 may be a circuit that operates a memory cell formed in the first region R1. For example, in the second region R2, peripheral circuit transistors electrically connected to the memory cell transistors of the first region R1 may be formed.

The third region R3 may correspond to a buffer region for ensuring a separation distance between the first and second regions R1 and R2. That is, the third region R3 may, e.g., completely, separate between the first and second regions R1 and R2, and prevent interference between the transistors of the first region R1 and the second region R2, when the transistors of the first region R1 and the second region R2 are driven.

A plurality of first fin type patterns 110 may be disposed on the substrate 100 of the first region R1. A plurality of second fin type patterns 210 may be disposed on the substrate 100 of the second region R2. The first fin type pattern 110 and the second fin type pattern 210 may extend long along the first direction X, respectively. Each of the first and second fin type patterns 110 and 210 may include a long side extending in the first direction X, and a short side extending in the second direction Y.

The first and second fin type patterns 110 and 210 may be a part of the substrate 100 and may include an epitaxial layer grown from the substrate 100. Each of the first and second fin type patterns 110 and 210 may include, e.g., silicon or germanium which is an elemental semiconductor material. Further, the first and second fin type patterns 110 and 210 may include a compound semiconductor, and may include, e.g., a group IV-IV compound semiconductor or a group III-V compound semiconductor. For example, if the first and second fin type patterns 110 and 210 include a group IV-IV compound semiconductor, the first and second fin type patterns 110 and 210 may include a binary compound or a ternary compound containing at least two or more of carbon (C), silicon (Si), germanium (Ge), and tin (Sn), or compounds obtained by doping these compounds with a group IV element. In another example, if the first and second fin type patterns 110 and 210 include a group III-V compound semiconductor, the first and second fin type patterns 110 and 210 may include one of a binary compound, a ternary compound, or a quaternary compound formed by combining at least one of aluminum (Al), gallium (Ga) and indium (In)

as the group III element and one of phosphorous (P), arsenic (As) or antimony (Sb) as the group V element V. In the semiconductor device according to some exemplary embodiments of the present disclosure, the first and second fin type patterns 110 and 210 are described as silicon fin type patterns including silicon.

For example, as illustrated in FIG. 2, the first region R1 and the second region R2 may be separated by a deep trench DT of a first depth h11 in a third Z direction. The first region R1 and the second region R2 may be defined by the deep trench DT. The third region R3 may be a region in which the deep trench DT of the first depth h11 is formed. The first fin type pattern 110 may be defined by a first shallow trench ST1 of a second depth h12 shallower than the first depth h11. For example, the depth h12 of the first shallow trench ST1 may be the height of the first fin type pattern 110. The second fin type pattern 210 may be defined by a second shallow trench ST2 of a third depth h13 shallower than the first depth h11. For example, the depth h13 of the second shallow trench ST2 may be the height of the second fin type pattern 210.

The field insulating film 105 may be formed on the substrate 100. The field insulating film 105 may fill a part of the deep trench DT and may fill some parts of the first and second shallow trenches ST1 and ST2. The field insulating film 105 may cover some of the sidewalls of the first and second fin type patterns 110 and 210. The upper surfaces of the first and second fin type patterns 110 and 210 may protrude upward from the upper surface of a field insulating film 105 formed adjacent to the long sides of the first and second fin type patterns 110 and 210. The field insulating film 105 may include, e.g., at least one of a silicon oxide film, a silicon nitride film, and a silicon oxynitride film.

Further, the field insulating film 105 may further include at least one or more field liner films formed between the first fin type pattern 110 and the field insulating film 105, and between the second fin type pattern 210 and the field insulating film 105. When the field insulating film 105 further includes the field liner film, the field liner film may contain at least one of, e.g., polysilicon, amorphous silicon, silicon oxynitride, silicon nitride, and silicon oxide.

The first gate structure 115 and the third gate structure 315 may be formed on the substrate 100 of the first region R1. The first gate structure 115 and the third gate structure 315 may extend long in the second direction Y on the field insulating film 105, respectively. The first gate structure 115 and the third gate structure 315 may be formed on the first fin type pattern 110 to intersect with the first fin type pattern 110. The first gate structure 115 and the third gate structure 315 may be separated by a second insulating structure 165.

The second gate structure 215 and the fourth gate structure 415 may be formed on the substrate 100 of the second region R2. Each of the second gate structure 215 and the fourth gate structure 415 may extend long in the second direction Y on the field insulating film 105. The second gate structure 215 and the fourth gate structure 415 may be formed on the second fin type pattern 210 to intersect with the second fin type pattern 210. The second gate structure 215 and the fourth gate structure 415 may be separated by a third insulating structure 170.

Each of the first and second gate structures 115 and 215 may include gate electrodes 120 and 220, gate insulating films 130 and 230, gate spacers 140 and 240, and gate trenches 140t and 240t defined by the gate spacers 140 and 240. In addition, each of the third and fourth gate structures 315 and 415 may include gate electrodes 320 and 420, gate insulating films 330 and 430, a gate spacer, and a gate trench defined by the gate spacer.

Since the explanation of the third gate structure 315 is similar to that of the first gate structure 115, and the explanation of the fourth gate structure 415 is similar to that of the second gate structure 215, the following description will be described on the basis of the first gate structure 115 and the second gate structure 215.

A plurality of first gate structures 115 extending long in the second direction Y may be disposed in the first region R1. The plurality of first gate structures 115 may be spaced apart from each other in the first direction X. For example, the first gate structure 115 may include a long side 115a extending in the second direction Y, and a short side 115b extending in the first direction X.

A plurality of second gate structures 215 extending long in the second direction Y may be disposed in the second region R2. The plurality of second gate structures 215 may be spaced apart from each other in the first direction X. For example, the second gate structure 215 may include a long side 215a extending in the second direction Y, and a short side 215b extending in the first direction X. The second gate structure 215 may be separated from the first gate structure 115 by the first insulating structure 160.

In the semiconductor device according to some exemplary embodiments of the present disclosure, the respective first gate structures 115 and the respective second gate structures 215 corresponding to each other may be disposed in a row along the second direction Y. For example, the first gate structure 115 and the second gate structure 215 corresponding to each other may be disposed in a row on a straight line extending in the second direction Y, e.g., the first gate structure 115 and the second gate structure 215 corresponding to each other may be disposed in a same row along the second direction Y. The short side 115b of the first gate structure and the short side 215b of the second gate structure corresponding to each other may be opposite to each other, e.g., the short side 115b of the first gate structure and the short side 215b of the second gate structure corresponding to each other may face each other from opposite sides of the first insulating structure 160. When viewing the first gate structure 115 and the second gate structure 215 along the second direction Y, the short side 115b of the first gate structure and the short side 215b of the second gate structure corresponding to each other may overlap each other.

Although the first and second gate structures 115 and 215 extending in the second direction Y are illustrated as four in FIG. 1, this is only for convenience of description, and the number of the first and second gate structures 115 and 215 is not limited thereto.

The first gate electrode 120 may be formed on the first fin type pattern 110 and the field insulating film 105. The first gate electrode 120 may wrap the first fin type pattern 110 protruding upward from the upper surface of the field insulating film 105. The second gate electrode 220 may be formed on the second fin type pattern 210 and the field insulating film 105. The second gate electrode 220 may wrap the second fin type pattern 210 protruding upward from the upper surface of the field insulating film 105.

Each of the first and second gate electrodes 120 and 220 may contain. e.g., at least one of titanium nitride (TiN), tantalum carbide (TaC), tantalum nitride (TaN), titanium silicon nitride (TiSiN), tantalum silicon nitride (TaSiN) tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminium carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel-platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (Zn), and combinations thereof. The first and second gate electrodes 120 and 220 may be formed through, but are not limited to, e.g., a replacement process (or a gate last process).

The first and second gate spacers 140 and 240 may be formed on the sidewalls of the first and second gate electrodes 120 and 220, respectively. Each of the first and second gate spacers 140 and 240 may contain at least one of, e.g., silicon nitride (SiN), silicon oxynitride (SiON), silicon oxide (SiO$_2$), and silicon oxycarbonitride (SiOCN).

The first gate insulating film 130 may be formed, e.g., between the first gate electrode 120 and the first fin type pattern 110, and between the first gate electrode 120 and the field insulating film 105. The first gate insulating film 130 may be formed along the profile of the first fin type pattern 110 protruding upward from the field insulating film 105. The first gate insulating film 130 may extend along the sidewalls and a bottom surface of the first gate trench 140t. The second gate insulating film 230 may be formed between the second gate electrode 220 and the second fin type pattern 210, and between the second gate electrode 220 and the field insulating film 105. The second gate insulating film 230 may be formed along the profile of the second fin type pattern 210 protruding upward from the field insulating film 105. The second gate insulating film 230 may extend along sidewalls and a bottom surface of the second gate trench 240t.

Unlike the configuration illustrated in FIG. 2 to FIG. 3b, an interfacial layer may be further formed between the first gate insulating film 130 and the first fin type pattern 110, and between the second gate insulating film 230 and the second fin type pattern 210. When the first and second fin type patterns 110 and 210 are silicon fin type patterns, the interfacial layer may contain, e.g., silicon oxide.

The first and second gate insulating films 130 and 230 may include a high dielectric material having a dielectric constant higher than the silicon oxide film. For example, each of the first and second gate insulating films 130 and 230 may contain at least one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first epitaxial pattern 150 may be formed on at least one side of the first gate structure 115. The second epitaxial pattern 250 may be formed on at least one side of the second gate structure 215. The first epitaxial pattern 150 may be formed on the first fin type pattern 110, and the second epitaxial pattern 250 may be formed on the second fin type pattern 210. The first epitaxial pattern 150 may be included in a source/drain of the transistor which uses the first fin type pattern 110 as a channel region, and the second epitaxial pattern 250 may be included in the source/drain of the transistor which uses the second fin type pattern 210 as a channel region.

The lower interlayer insulating film 191 is formed on the field insulating film 105 and may cover the first epitaxial pattern 150 and the second epitaxial pattern 250. The lower interlayer insulating film 191 may be formed around the first to fourth gate structures 115, 215, 315, and 415. The lower interlayer insulating film 191 may wrap at least a part of sidewalls of the first to fourth gate structures 115, 215, 315, and 415.

The first insulating structure 160 may be disposed on the substrate 100 of the third region R3. The first insulating structure 160 may be disposed on the field insulating film 105 of the buffer region which separates the first region R1 and the second region R2. The first insulating structure 160 may be formed across the entirety between the first region R1 and the second region R2, e.g., the first insulating structure 160 may extend continuously along the entire first and second regions R1 and R2. For example, the first insulating structure 160 may include a long side extending in the first direction X.

The first insulating structure 160 may be formed across the part between the first gate structure 115 and the second gate structure 215. The first insulating structure 160 may separate the first gate structure 115 and the second gate structure 215.

The first insulating structure 160 may be disposed between the short side 115b of the first gate structure 115 and the short side 215b of the second gate structure 215. The first insulating structure 160 may be in contact with the first gate structure 115 and the second gate structure 215. The third gate structure 315 and the fourth gate structure 415 may not be in contact with the first insulating structure 160.

Since the first insulating structure 160 is formed across the entirety between the first region R1 and the second region R2, the two first gate structures 115 and the two second gate structures 215 spaced apart farthest from each other in the first direction X may be in contact with the first insulating structure 160. The first insulating structure 160 may be formed in a first separation trench 160t defined by a lower interlayer insulating film 191, and the first and second gate structures 115 and 215.

The second insulating structure 165 may be disposed on the substrate 100 of the first region R1. A plurality of second insulating structures 165 may be formed in the first region R1. The second insulating structure 165 is defined by the first shallow trench ST1 and may be formed between the adjacent first fin type patterns 110. The second insulating structure 165 may separate the first gate structure 115 and the third gate structure 315 from each other. The first gate structure 115 may be disposed between the first insulating structure 160 and the second insulating structure 165.

The second insulating structure 165 may be in contact with the first gate structure 115 and the third gate structure 315. One second insulating structure 165 may be in contact with some of the plurality of first gate structures 115 formed in the first region R1. The number of first gate structures 115 being in contact with the first insulating structure 160 may be larger than the number of first gate structures 115 being in contact with one second insulating structure 165.

For example, the second insulating structure 165 may be in contact with one first gate structure 115 and may be in contact with two or more first gate structures 115. The second insulating structure 165 may be formed in a second separation trench 165t defined by the lower interlayer insulating film 191, and the first and third gate structures 115 and 315.

In FIG. 5, the second insulating structure 165 being in contact with two first gate structures 115 and two third gate structures 315 is illustrated as not being in contact with the gate structure 115 adjacent in the first direction X but the disclosure is not limited thereto. In other words, while FIG. 1 illustrates the second insulating structure 165 as having a length contacting and intersecting only two first gate structures 115 and only two third gate structures 315, a length of the second insulating structure 165 may be modified to contact and intersect only one first gate structure 115 and one third gate structure 315 or more than two first gate structures 115 and more than two third gate structures 315. For example, the second insulating structure 165 may come into contact with the first gate structure 115 adjacent in the first direction X on both sides and may come into contact with the first gate structure 115 on only one side, e.g., the second insulating structure 165 may come into contact with three or four of the first gate structures 115 illustrated in FIG. 1.

Further, in FIG. 5, the first gate structure 115 is illustrated as being disposed on both sides of the second insulating structure 165 along the first direction X, but the disclosure is not limited thereto. For example, the first gate structure 115 may be disposed on one side of the second insulating structure 165 along the first direction X, and the third gate structure 315 may be disposed on the other side thereof along the first direction X.

Since the second insulating structure 165 is not arranged in a row along the first direction X, the lengths of the first gate structures 115 adjacent to each other in the second direction Y may be different from each other. For example, since the second insulating structure 165 is arranged in a column along the first direction X, and since the lengths of the first gate structures 115 along the second direction Y may be different from each other, some of the first gate structures 115 may be too short along the second direction Y to be at a lateral side of the second insulating structure 165, e.g., so in this instance the third gate structure 315 may be disposed at a lateral side of the second insulating structure 165.

The third insulating structure 170 may be disposed on the substrate 100 of the second region R2. A plurality of third insulating structures 170 may be formed in the second region R2. The third insulating structure 170 is defined by the second shallow trench ST2 and may be formed between the adjacent second fin type patterns 210. The third insulating structure 170 may separate the second gate structure 215 and the fourth gate structure 415. The second gate structure 215 may be disposed between the first insulating structure 160 and the third insulating structure 170.

The third insulating structure 170 may be in contact with the second gate structure 215 and the fourth gate structure 415. One third insulating structure 170 may be in contact with some of the plurality of second gate structures 215 formed in the second region R2. The number of second gate structures 215 being in contact with the first insulating structure 160 may be larger than the number of second gate structures 215 being in contact with one third insulating structure 170.

For example, the third insulating structure 170 may be in contact with one second gate structure 215 and may be in contact with two or more second gate structures 215. The third insulating structure 170 may be formed in a third separation trench 170t defined by the lower interlayer insulating film 191, and the second and fourth gate structures 215 and 415.

The first to third insulating structures 160, 165, and 170 may include a material having an etch selectivity with respect to the lower interlayer insulating film 191. The first to third insulating structures 160, 165, and 170 may contain, e.g., at least one of silicon oxide ($SiO_2$), silicon nitride (SiN), silicon oxynitride (SiON), silicon carbonitride (SiCN), and silicon oxycarbonitride (SiOCN).

In FIG. 2, FIG. 4, and FIG. 5, although each of the first to third insulating structures 160, 165, and 170 are illustrated as being formed of a single film, this is only for convenience of description, and the disclosure is not limited thereto.

In the semiconductor device according to some exemplary embodiments of the present disclosure, the first gate insulating film 130 may extend along the sidewalls of the first insulating structure 160 and the sidewalls of the second insulating structure 165. The second gate insulating film 230 may extend along the sidewalls of the first insulating structure 160 and the sidewalls of the third insulating structure 170. In addition, the third gate insulating film 330 may extend along the sidewalls of the second insulating structure 165, and the fourth gate insulating film 430 may extend along the sidewalls of the third insulating structure 170.

Thus, the first gate electrode 120 may not be in direct contact with the first insulating structure 160 and the second insulating structure 165, and the second gate electrode 220 may not be in direct contact with the first insulating structure 160 and the third insulating structure 170. Further, the third gate electrode 320 may not be in direct contact with the second insulating structure 165, and the fourth gate electrode 420 may not be in direct contact with the third insulating structure 170.

In the semiconductor device according to some exemplary embodiments of the present disclosure, a width W11 of the first insulating structure 160 in the second direction Y may be different from a width W21 of the second insulating structure 165 in the second direction Y. For example, the width W11 of the first insulating structure 160 in the second direction Y may be greater than the width W21 of the second insulating structure 165 in the second direction Y. The width W11 of the first insulating structure 160 in the second direction Y may be equal to or greater than a width W31 of the third insulating structure 170 in the second direction Y. Since the first insulating structure 160 is a structure for separating the first region R1 and the second region R2 that perform the different functions, the width W11 of the first insulating structure 160 in the second direction Y may be greater than the width W21 of the second insulating structure 165 in the second direction Y.

Since the first insulating structure 160 is formed across the entirety between the first region R1 and the second region R2, the width W12 of the first insulating structure 160 in the first direction X may be greater than a width GSW1 of the first gate structure 115 in the first direction X and a width GSW2 of the second gate structure 215 in the first direction X. For example, the width GSW1 of the first gate structure 115 in the first direction X may be substantially equal to the width GSW2 of the second gate structure 215 in the first direction X.

Further, one second insulating structure 165 may be in contact with a part of the plurality of first gate structures 115 formed in the first region R1, and one third insulating structure 170 may be in contact with a part of the plurality of second gate structures 215 formed in the second region R2. Thus, the width W12 of the first insulating structure 160 in the first direction X may be greater than the width W22 of the second insulating structure 165 in the first direction X and the width W32 of the third insulating structure 170 in the first direction X.

The upper surface of the lower interlayer insulating film 191 may be placed on the same plane as the upper surface of the first gate structure 115 and the upper surface of the second gate structure 215. For example, the upper surface of the lower interlayer insulating film 191 may be placed on the same plane as the upper surface of the first gate electrode 120 and the upper surface of the second gate electrode 220. Similarly, the upper surface of the lower interlayer insulating film 191 may be placed on the same plane as the upper surface of the third gate structure 315 and the upper surface of the fourth gate structure 415.

For example, the upper surface of the lower interlayer insulating film 191 may be placed on the same plane as the upper surfaces of the first to third insulating structures 160, 165, and 170. Also, the upper surfaces of the first to fourth gate structures 115, 215, 315, and 415 may be placed on the same plane as the upper surfaces of the first to third insulating structures 160, 165, and 170. Here, the meaning of term "plane" includes fine dicing of the upper surface of the lower interlayer insulating film 191 that may be generated during the planarization process, and the upper surfaces of the first to third insulating structures 160, 165, and 170.

The upper interlayer insulating film 192 is formed on the lower interlayer insulating film 191, the first to third insulating structures 160, 165, and 170, and the first to fourth gate structures 115, 215, 315, and 415. The interlayer insulating film 190 includes the lower interlayer insulating film 191 and the upper interlayer insulating film 192.

Each of the lower interlayer insulating film 191 and the upper interlayer insulating film 192 may include, but is not limited to, e.g., silicon oxide, silicon nitride, silicon oxynitride, FOX (Flowable Oxide), TOSZ (Tonen SilaZene), USG (Undoped Silica Glass) BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silica Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof.

Figure 6:
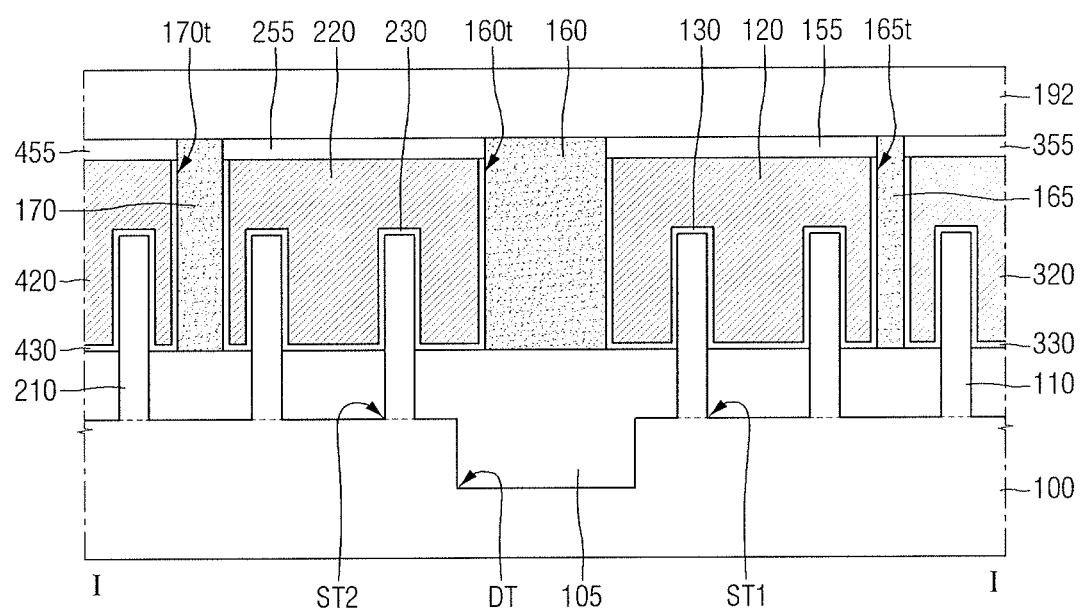
FIG. 6 and FIG. 7 illustrate cross-sectional views along lines I-I and II-II of FIG. 1, respectively, according to some other exemplary embodiments of the present disclosure.
Figure 7:
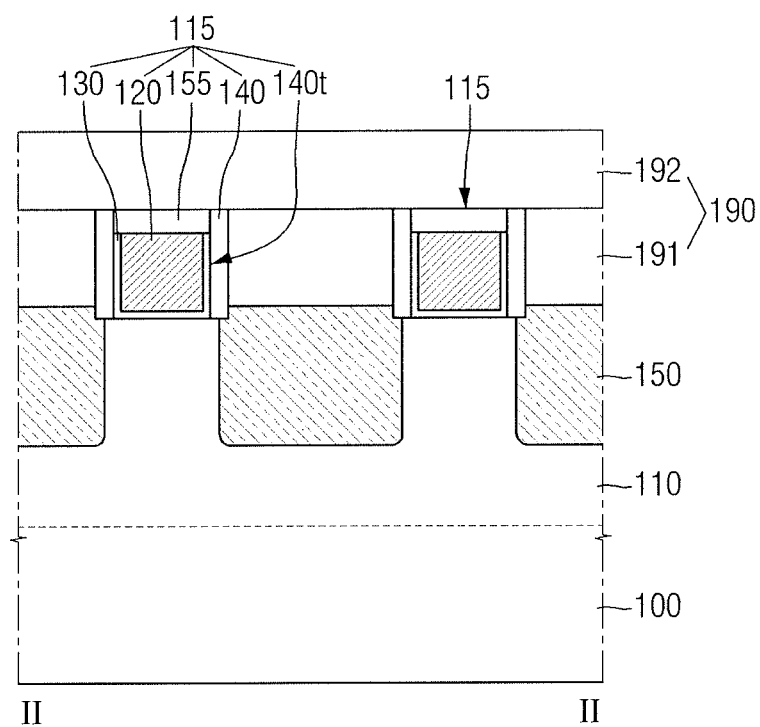

FIG. 6 and FIG. 7 are diagrams for explaining the semiconductor device according to some exemplary embodiments of the present disclosure. For convenience of explanation, differences from those described with reference to FIG. 1 to FIG. 5 will be mainly described.

Referring to FIG. 1, FIG. 6, and FIG. 7, in the semiconductor device according to some exemplary embodiments of the present disclosure, the first to fourth gate structures 115, 215, 315, and 415 may further include first to fourth capping patterns 155, 255, 355, and 455, respectively. A first capping pattern 155 may be formed on the first gate electrode 120, and a second capping pattern 255 may be formed on the second gate electrode 220. A third capping pattern 355 may be formed on the third gate electrode 320, and a fourth capping pattern 455 may be formed on the fourth gate electrode 420. For example, the first gate electrode 120 may fill a part of the first gate trench 140t, while the first capping pattern 155 may fill the rest of the first gate trench 140t which is left after the first gate electrode 120 is formed.

The first to fourth capping patterns 155, 255, 355, and 455 may include a material having an etch selectivity with respect to the lower interlayer insulating film 191. Each of the first to fourth capping patterns 155, 255, 355, and 455 may include, e.g., at least one of silicon oxide ($SiO_2$), silicon nitride (SiN), silicon oxynitride (SiON), silicon carbonitride (SiCN) and silicon oxycarbonitride (SiOCN).

FIG. 6 illustrates a configuration in which the first gate insulating film 130 does not extend between the first capping pattern 155 and the first insulating structure 160, and between the first capping pattern 155 and the second insulating structure 165, and the second gate insulating film 230 does not extend between the second capping pattern 255 and the first insulating structure 160, and between the second capping pattern 255 and the third insulating structure 170, but the disclosure is not limited thereto. Although FIG. 6 illustrates a configuration in which the third gate insulating film 330 does not extend between the third capping pattern 355 and the second insulating structure 165, and the fourth gate insulating film 430 does not extend between the fourth capping pattern 455 and the third insulating structure 170, the disclosure is not limited thereto.

Since the upper surface of the lower interlayer insulating film 191 may be placed on the same plane as the upper surfaces of the first to fourth gate structures 115, 215, 315, and 415, the upper surface of the lower interlayer insulating film 191 may be placed on the same plane as the upper surfaces of the first to fourth capping patterns 155, 255, 355, and 455.

Unlike the configuration illustrated in FIG. 6, the first to third insulating structures 160, 165, and 170 may be formed at the same level as the first to fourth capping patterns 155, 255, 355, and 455. Here, the term "same level" means the formation using the same manufacturing process. Therefore, the first to third insulating structures 160, 165, and 170, and the first to fourth capping patterns 155, 255, 355, and 455 may be integral structures.

Figure 8:
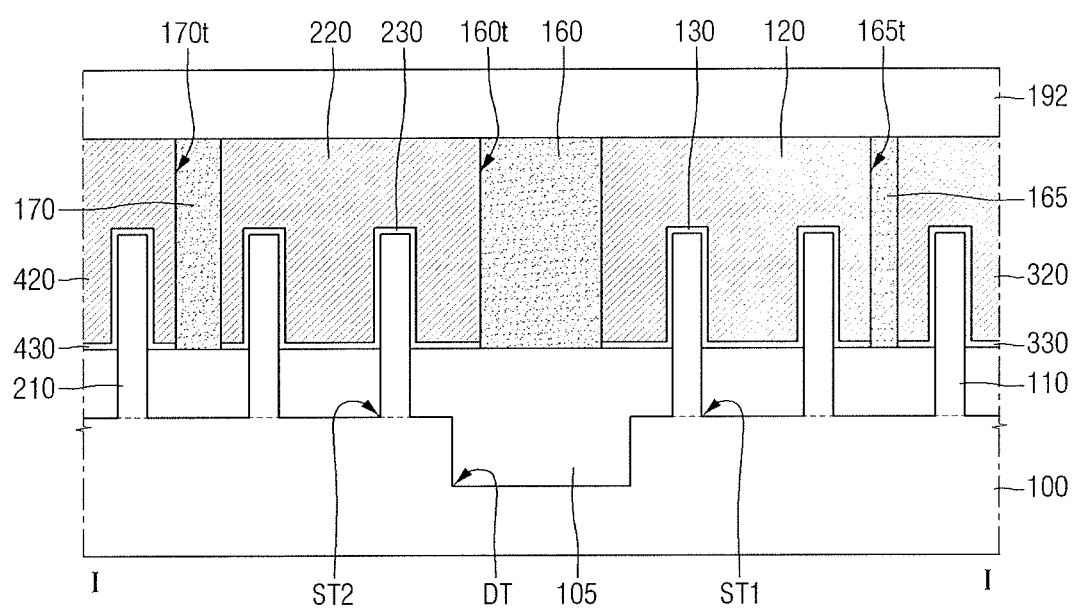
FIG. 8 illustrates a cross-sectional view of a semiconductor device according to some exemplary embodiments of the present disclosure.
Figure 9:
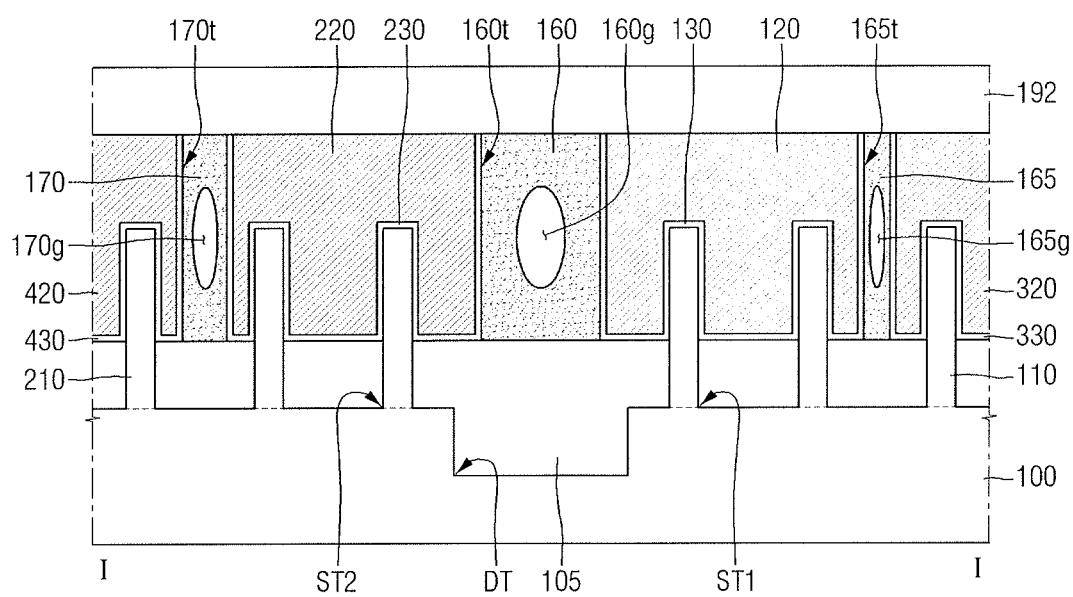
FIG. 9 illustrates a cross-sectional view of a semiconductor device according to some exemplary embodiments of the present disclosure.
Figure 10:
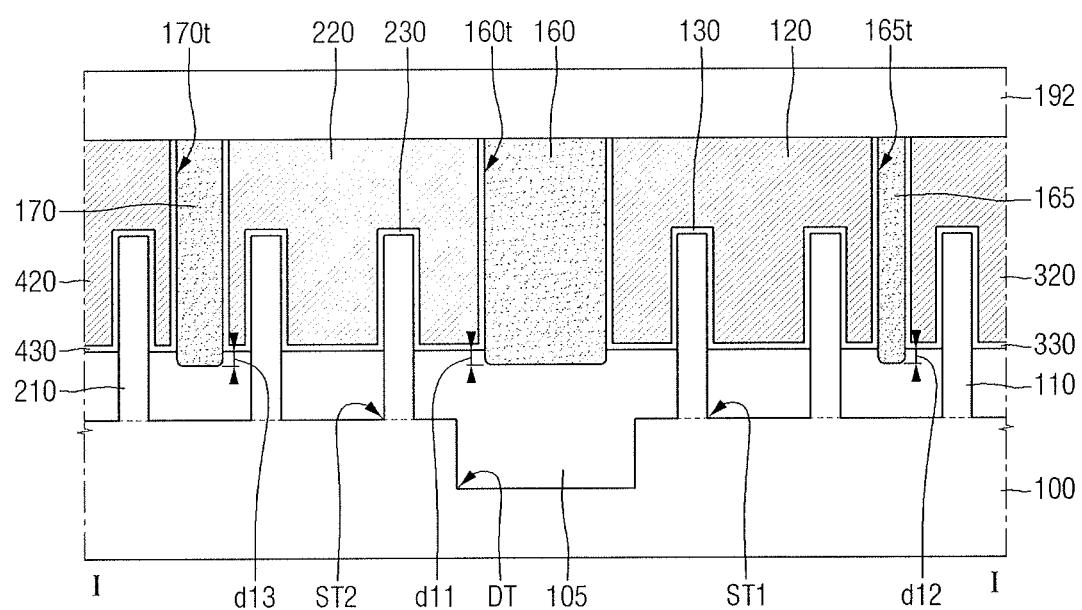
FIG. 10 illustrates a cross-sectional view of a semiconductor device according to some exemplary embodiments of the present disclosure.

FIG. 8 is a diagram for explaining the semiconductor device according to some exemplary embodiments of the present disclosure. FIG. 9 is a diagram for explaining the semiconductor device according to some exemplary embodiments of the present disclosure. FIG. 10 is a diagram for explaining the semiconductor device according to some exemplary embodiments of the present disclosure. For convenience of explanation, differences from those described with reference to FIG. 1 to FIG. 5 will be mainly described.

Referring to FIG. 8, in the semiconductor device according to some exemplary embodiments of the present disclosure, each of the first gate insulating film 130 and the second gate insulating film 230 does not extend along the sidewalls of the first insulating structure 160. Each of the first gate insulating film 130 and the third gate insulating film 330 does not extend along the sidewalls of the second insulating structure 165. Each of the second gate insulating film 230 and the fourth gate insulating film 430 does not extend along the sidewalls of the third insulating structure 170.

Thus, the first insulating structure 160 may come into contact with the first gate electrode 120 and the second gate electrode 220. The second insulating structure 165 may be in contact with the first gate electrode 120 and the third gate electrode 320, and the third insulating structure 170 may be in contact with the second gate electrode 220 and the fourth gate electrode 420.

Referring to FIG. 9, the semiconductor device according to some exemplary embodiments of the present disclosure may further include a first air gap 160g formed in the first insulating structure 160, a second air gap 165g formed in the second insulating structure 165, and a third air gap 170g formed in the third insulating structure 170. The first air gap 160g is surrounded by the first insulating structure 160, the second air gap 165g is surrounded by the second insulating structure 165, and the third air gap 170g may be surrounded by the third insulating structure 170. However, embodiments are not limited to the above, e.g., only one of the first to third air gaps 160g, 165g, and 170g may be formed.

Referring to FIG. 1 and FIG. 10, in the semiconductor device according to some exemplary embodiments of the present disclosure, the bottom surfaces of the first to third insulating structures 160, 165, and 170 may be lower than the bottom surfaces of the first to fourth gate structures 115, 215, 315, and 415.

On the basis of the upper surface of the field insulating film 105, the bottom surface of the first insulating structure 160 may be lower by the fourth depth d11 than the bottom surface of the adjacent first gate structure 115 and the bottom surface of the second gate structure 215. The bottom surface of the second insulating structure 165 may be lower by a fifth depth d12 than the bottom surface of the adjacent first gate structure 115 and the bottom surface of the third gate structure 315. The bottom surface of the third insulating structure 170 may be lower by a sixth depth d13 than the bottom surface of the adjacent second gate structure 215 and the bottom surface of the fourth gate structure 415.

During the formation of the first to third separation trenches 160t, 165t, and 170t, the field insulating film 105 may be excessively etched. The bottom surfaces of the first to third insulating structures 160, 165, and 170 may be lower than the bottom surfaces of the first to fourth gate structures 115, 215, 315, and 415 by the fourth to sixth depths d11, d12, and d13. Although the fourth to sixth depths d11, d12, and d13 are illustrated to be the same in FIG. 10, they are for convenience of explanation and are not limited thereto.

Figure 11:
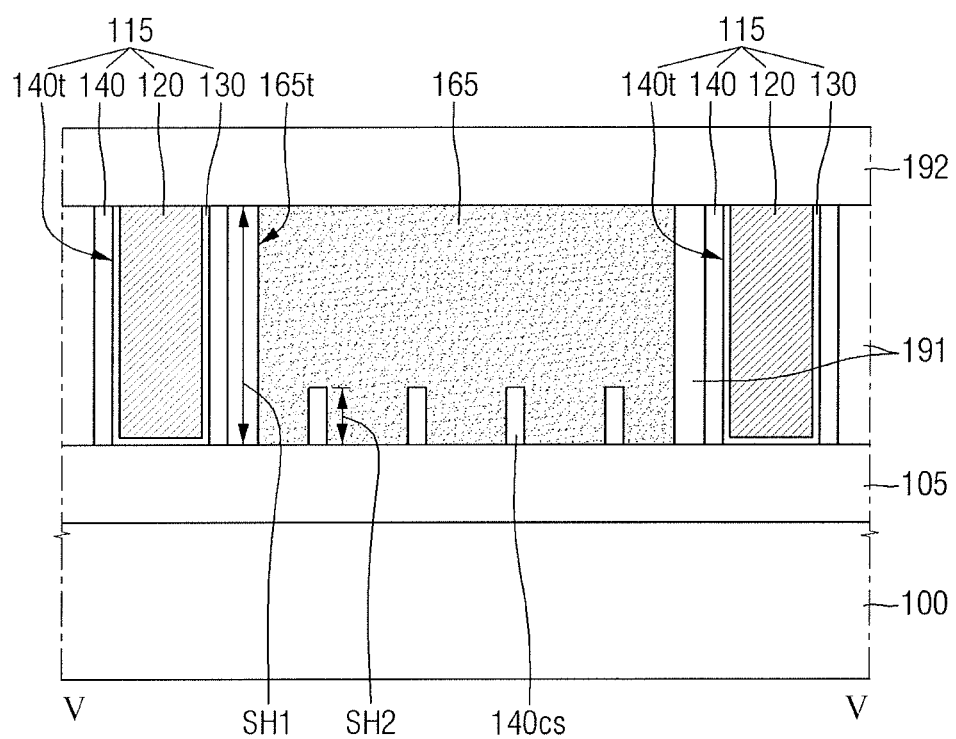
FIG. 11 illustrates a cross-sectional view of a semiconductor device according to some exemplary embodiments of the present disclosure.
Figure 12:
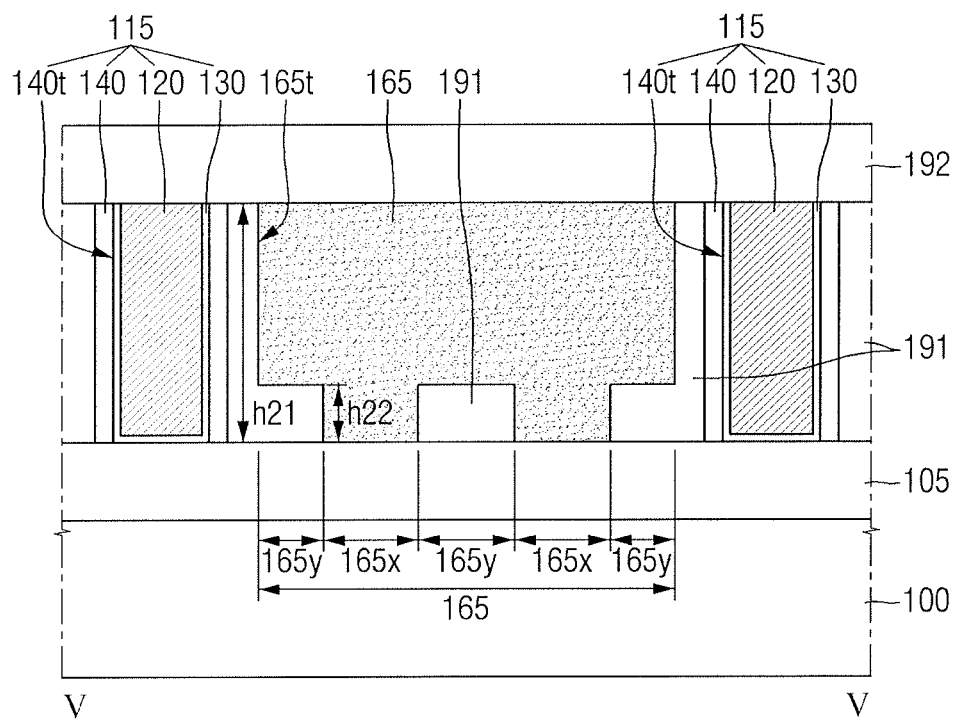
FIG. 12 illustrates a cross-sectional view of a semiconductor device according to some exemplary embodiments of the present disclosure.

FIG. 11 is a diagram for explaining the semiconductor device according to some exemplary embodiments of the present disclosure. FIG. 12 is a diagram for explaining the semiconductor device according to some exemplary embodiments of the present disclosure. For convenience of explanation, differences from those described with reference to FIG. 1 to FIG. 5 will be mainly described.

Referring to FIG. 1 and FIG. 11, the semiconductor device according to some exemplary embodiments of the present disclosure may further include a first connecting spacer 140cs protruding from the upper surface of the field insulating film 105, between the second insulating structure 165 and the field insulating film 105.

The first connecting spacer 140cs may be recessed in the second insulating structure 160. Except for the bottom surface of the first connecting spacer 140cs, the sidewalls and the upper surface of the first connecting spacer 140cs may be surrounded by the first insulating structure 160.

The height SH2 of the first connecting spacer 140cs is smaller than the height SH1 of the first gate spacer 140. Since the bottom surface of the first connecting spacer 140cs and the bottom surface of the first gate spacer 140 may be in contact with the field insulating film 105, the upper surface of the first gate spacer 140 is higher than the first connecting spacer 140cs.

Also, the first connecting spacer 140cs connects the first gate structure 115 and the third gate structure 315. That is, the first connecting spacer 140cs is in contact with the first gate structure 115 and the third gate structure 315. The first connecting spacer 140cs includes the same material as the first gate spacer 140.

Likewise, a connecting spacer having a shape similar to that of the first connecting spacer 140cs may be further formed between the first gate structure 115 and the second gate structure 215, and between the second gate structure 215 and the fourth gate structure 415. For example, the first connecting spacer 140cs may be a structure formed by non-removal of a part of the gate spacer in the etching process of forming the second separation trench 165.

Referring to FIG. 1 and FIG. 12, in the semiconductor device according to some exemplary embodiments of the present disclosure, a part of the lower interlayer insulating film 191 may be interposed between the second insulating structure 165 and the field insulating film 105.

For example, the second insulating structure 165 may include a first portion 165x which is in contact with the first and third gate structures 115 and 315, and a second portion 165y which is not in contact with the first and third gate structures 115 and 315. The first portion 165x of the second insulating structure may be located between the first gate structure 115 and the third gate structure 315.

A part of the lower interlayer insulating film 191 may be interposed between the second portion 165y of the second insulating structure and the field insulating film 105. The height h22 from the field insulating film 105 to the bottom surface of the second portion 165y of the second insulating structure is smaller than the height h21 from the field insulating film 105 to the upper surface of the first gate structure 115.

Likewise, a part of the lower interlayer insulating film 191 may be left between the first insulating structure 160 and the field insulating film 105 which are not in contact with the first and second gate structures 115 and 215. A part of the lower interlayer insulating film 191 may also be left between the third insulating structure 170 and the field insulating film 105 which are not in contact with the second and fourth gate structures 215 and 415. The bottom surfaces of the first and third insulating structures 160 and 170 may also include irregularities, as in the bottom surface of the second insulating structure 165.

Figure 13:
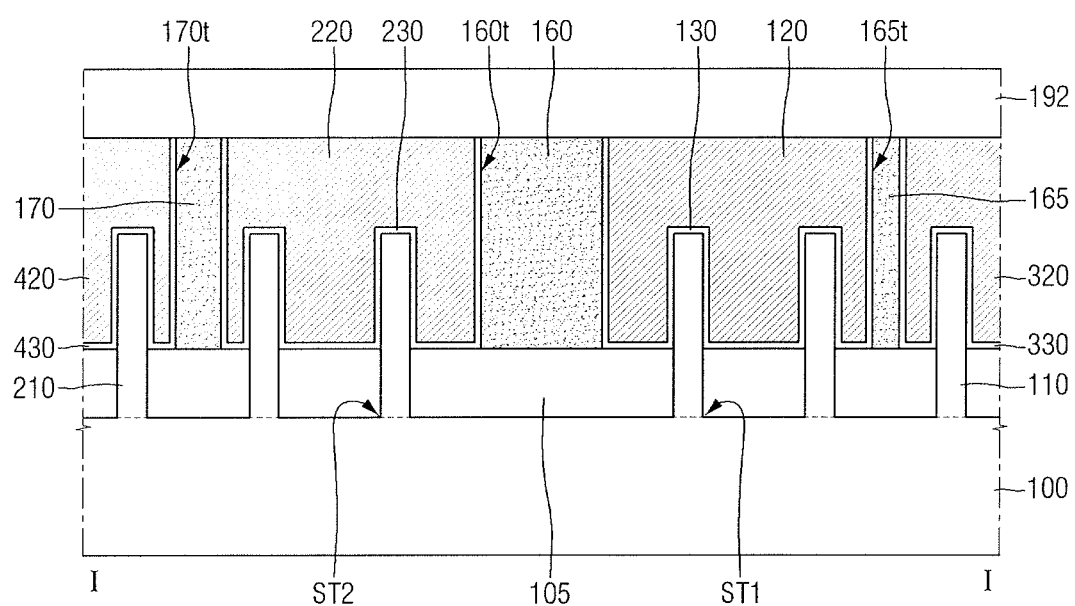
FIG. 13 illustrates a cross-sectional view of a semiconductor device according to some exemplary embodiments of the present disclosure.
Figure 14:
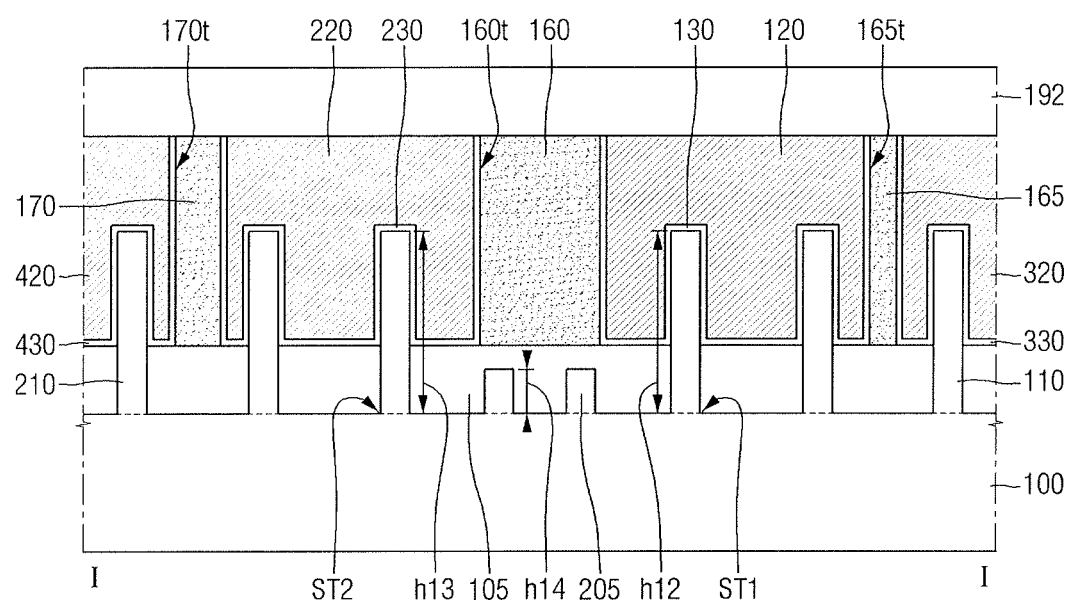
FIG. 14 illustrates a cross-sectional view of a semiconductor device according to some exemplary embodiments of the present disclosure.

FIG. 13 is a diagram for explaining the semiconductor device according to some exemplary embodiments of the present disclosure. FIG. 14 is a diagram for explaining the semiconductor device according to some exemplary embodiments of the present disclosure. For convenience of explanation, differences from those described with reference to FIG. 1 to FIG. 5 will be mainly described.

Referring to FIG. 1, FIG. 13, and FIG. 14, in the semiconductor device according to some exemplary embodiments of the present disclosure, a deep trench (DT of FIG. 2) defining the first region R1 and the second region R2 may not be formed.

In FIG. 13, a semiconductor pattern protruding upward from the substrate 100 may not be formed on the substrate 100 of the third region R3.

In FIG. 14, at least one or more protruding pattern 205 protruding from the substrate 100 may be disposed on the substrate of the third region R3. The protruding pattern 205 may extend in the first direction X, as in the first fin type pattern 110 and the second fin type pattern 210. The protruding pattern 205 may include the same material as the first fin type pattern 110 and the second fin type pattern 210.

The field insulating film 105 may cover the upper surface of the protruding pattern 205. The field insulating film 105 may be interposed between the first insulating structure 160 and the protruding pattern 205. The height h14 of the protruding pattern 205 may be smaller than the height h12 of the first fin type pattern 110 and the height h13 of the second fin type pattern 210.

Figure 15:
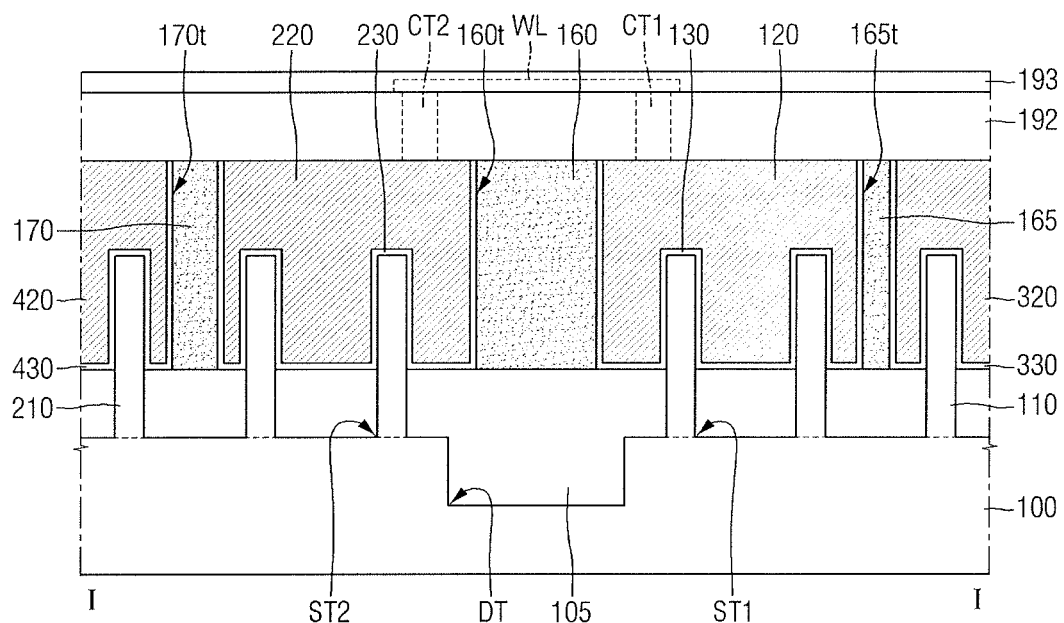
FIG. 15 illustrates a cross-sectional view of a semiconductor device according to some exemplary embodiments of the present disclosure.

FIG. 15 is a diagram for explaining the semiconductor device according to some exemplary embodiments of the present disclosure. For convenience of explanation, differences from those described with reference to FIG. 1 to FIG. 5 will be mainly described.

Referring to FIG. 15, the semiconductor device according to some exemplary embodiments of the present disclosure may further include a first contact CT1, a second contact CT2, and a connection wiring WL.

The first contact CT1 and the second contact CT2 may be formed in the upper interlayer insulating film 192. The connection wiring WL may be formed in the wiring insulating film 193 on the upper interlayer insulating film 192.

The first contact CT1 may be electrically connected to the memory cell transistor formed in the first region R1. The second contact CT2 may be electrically connected to the transistor of the peripheral circuit formed in the second region R2. The connection wiring WL may electrically connect the first contact CT1 and the second contact CT2.

Figure 16:
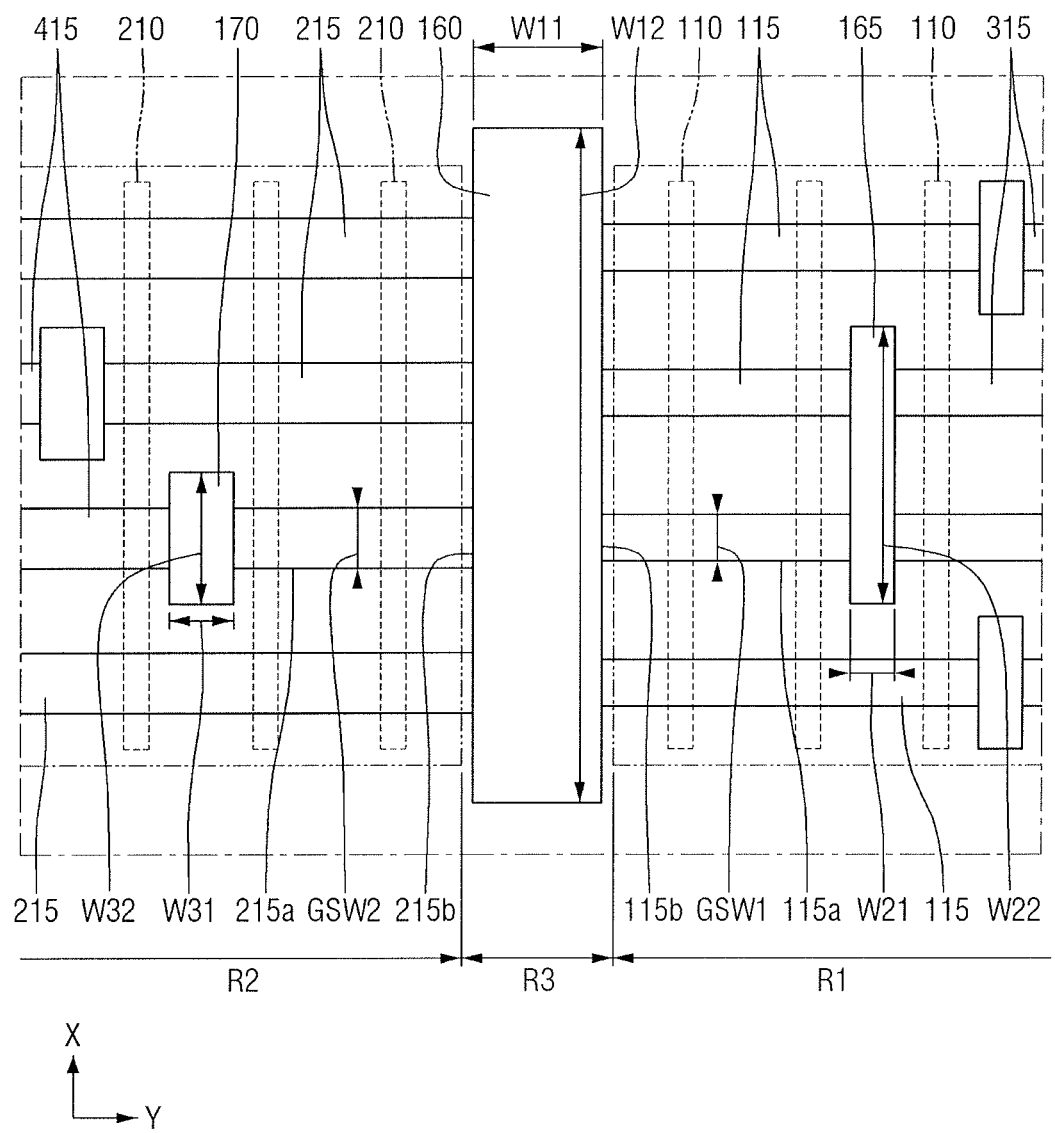
FIG. 16 illustrates a plan view of a semiconductor device according to some exemplary embodiments of the present disclosure.

FIG. 16 is a plan view for explaining the semiconductor device according to some exemplary embodiments of the present disclosure. For convenience of explanation, differences from those described with reference to FIG. 1 to FIG. 5 will be mainly described.

Referring to FIG. 16, in the semiconductor device according to some exemplary embodiments of the present disclosure, the width GSW1 of the first gate structure 115 in the first direction X may be different from the width GSW2 of the second gate structure 215 in the first direction X. Although the width GSW1 of the first gate structure 115 in the first direction X is illustrated as being smaller than the width GSW2 of the second gate structure 215 in the first direction X, the opposite case may be possible.

Figure 17:
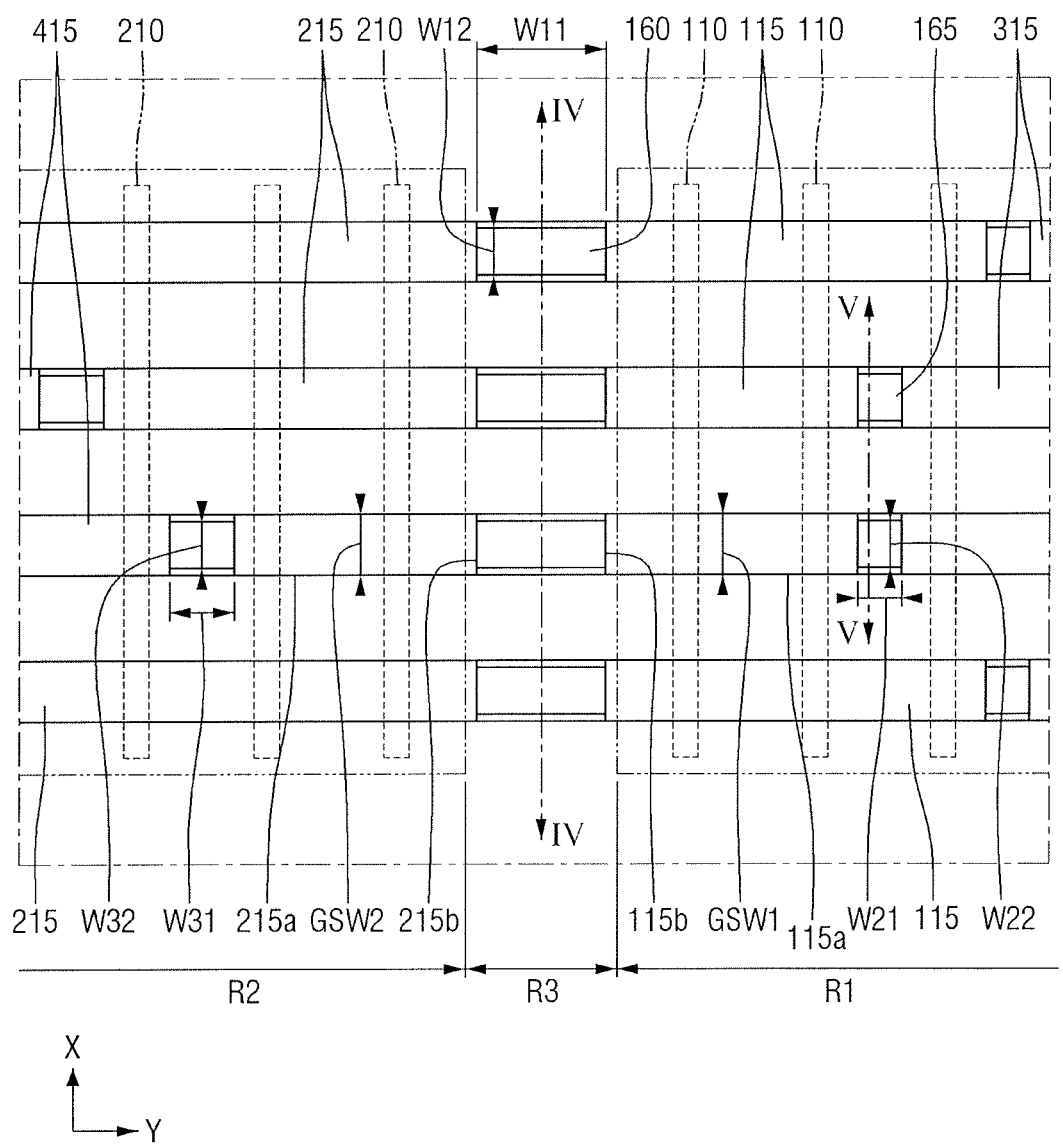
FIG. 17 illustrates a plan view of a semiconductor device according to some exemplary embodiments of the present disclosure.
Figure 18:
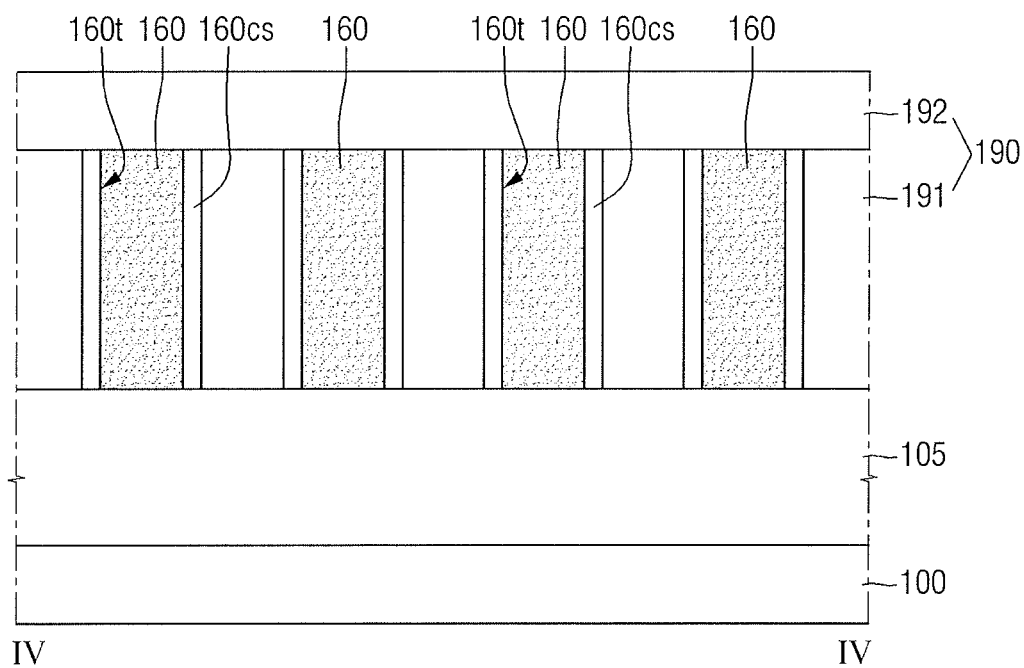
FIG. 18 illustrates a cross-sectional view along line IV-IV of FIG. 17.
Figure 19:
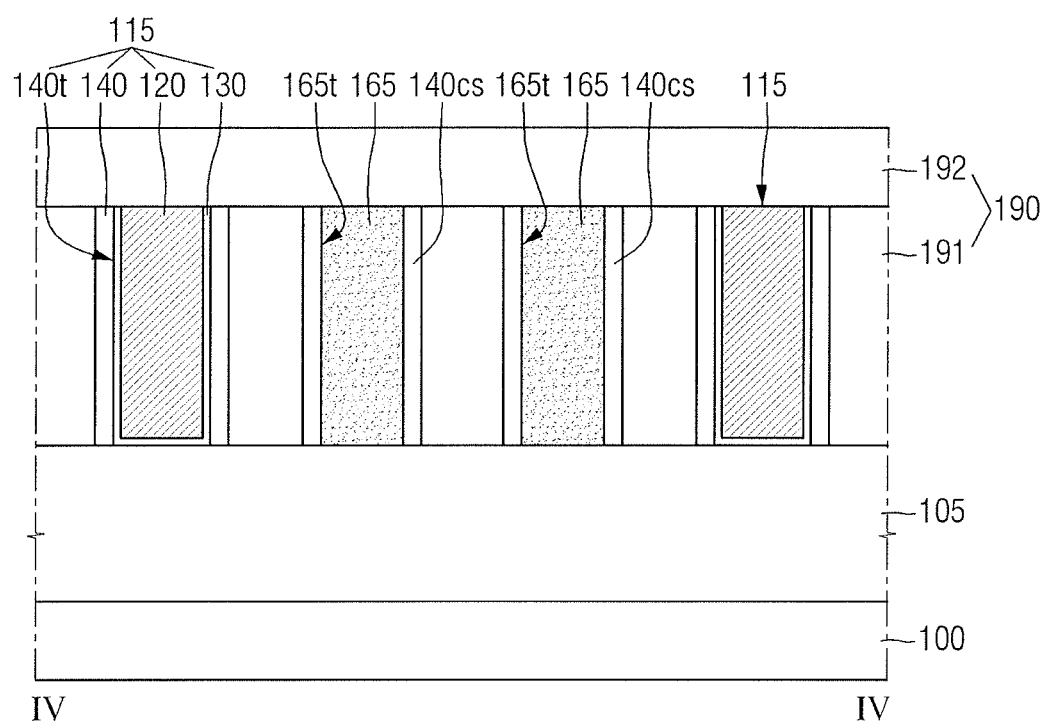
FIG. 19 illustrates a cross-sectional view along line V-V in FIG. 17.

FIG. 17 is a plan view for explaining the semiconductor device according to some exemplary embodiments of the present disclosure. FIG. 18 is a cross-sectional view taken along line IV-IV of FIG. 17. FIG. 19 is a cross-sectional view taken along line V-V of FIG. 17. For convenience of explanation, differences from those described with reference to FIG. 1 to FIG. 5 will be mainly described.

Referring to FIG. 17 to FIG. 19, in the semiconductor device according to some exemplary embodiments of the present disclosure, a plurality of first insulating structures 160 may be disposed on the third region R3. The first insulating structure 160 may be disposed between one first gate structure 115 and one second gate structure 215. The plurality of first insulating structures 160 may be disposed in a row on a straight line extending in the first direction X.

The second insulating structure 165 may be disposed between one first gate structure 115 and one third gate structure 315. The third insulating structure 170 may be disposed between one second gate structure 215 and one fourth gate structure 415.

As an example, when the width GSW1 of the first gate structure 115 in the first direction X is substantially equal to the width GSW2 of the second gate structure 215 in the first direction X, the width W12 of the first insulating structure 160 in the first direction X may be smaller than the width GSW1 of the first gate structure 115 in the first direction X.

As another example, when the width GSW1 of the first gate structure 115 in the first direction X is smaller than the width GSW2 of the second gate structure 215 in the first direction X, the width W12 of the first insulating structure 160 in the first direction X may be smaller than the width GSW2 of the second gate structure 215 in the first direction X. As another example, when the width GSW1 of the first gate structure 115 in the first direction X is large than the width GSW2 of the second gate structure 215 in the first direction X, the width W12 of the first insulating structure 160 in the first direction X may be smaller than the width GSW1 of the first gate structure 115 in the first direction X.

In FIG. 17, the width W11 of the first insulating structure 160 in the second direction Y may be larger than the width W21 of the second insulating structure 165 in the second direction Y. The width W11 of the first insulating structure 160 in the second direction Y may be larger than or equal to the width W31 of the third insulating structure 170 in the second direction Y.

A second connecting spacer 160cs may be disposed on the sidewalls of the first insulating structure 160. The second connecting spacer 160cs may connect the first gate structure 115 and the second gate structure 215. The second connecting spacer 160cs may include the same material as the first gate spacer 140.

A first connecting spacer 140cs may be disposed on the sidewalls of the second insulating structure 165. The first connecting spacer 140cs may connect the first gate structure 115 and the third gate structure 315. The first connecting spacer 140cs may include the same material as the first gate spacer 140. Similarly, a connecting spacer for connecting the second gate structure 215 and the fourth gate structure 415 may be disposed on the sidewalls of the third insulating structure 170.

Figure 20:
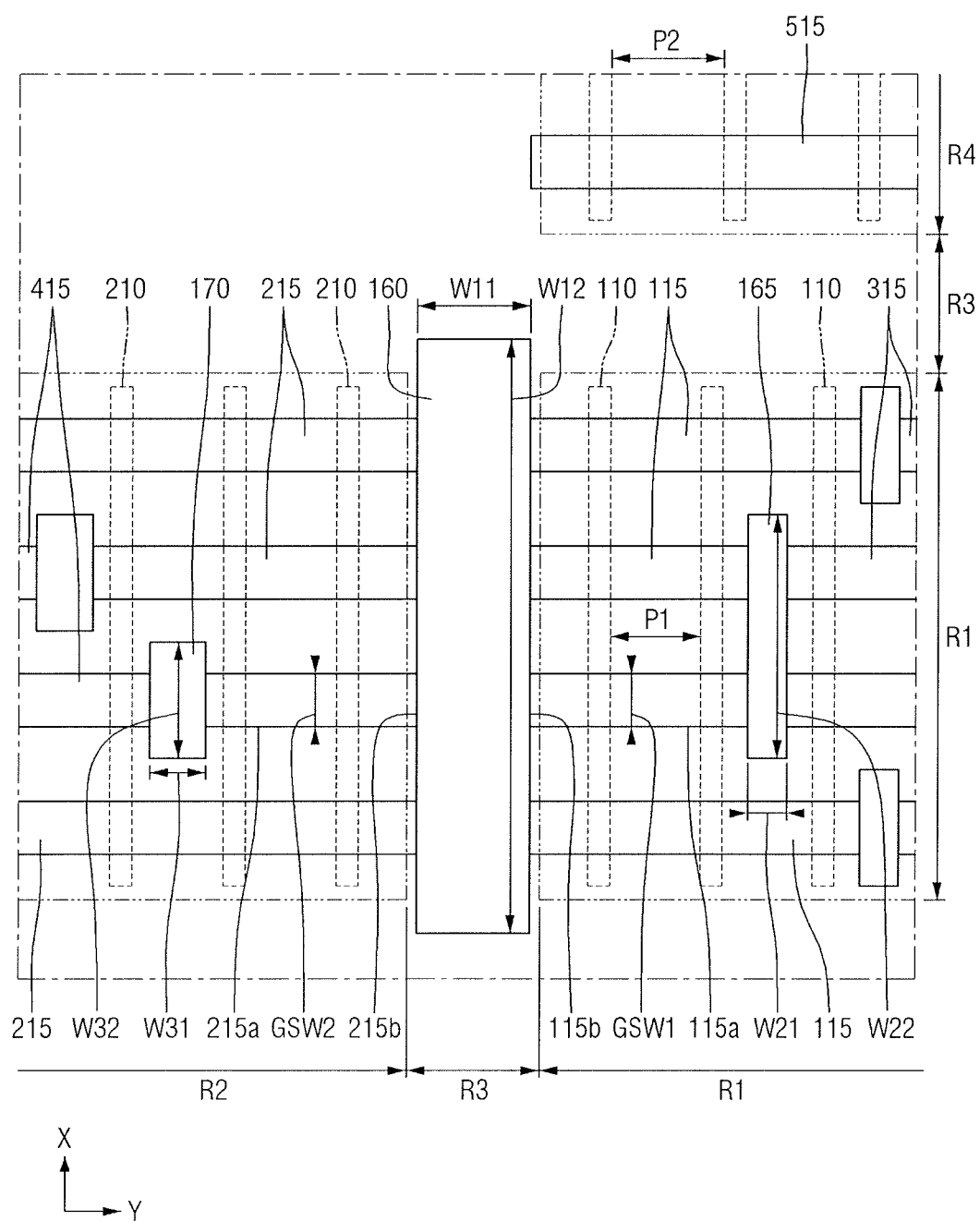
FIG. 20 illustrates a plan view of a semiconductor device according to some exemplary embodiments of the present disclosure.

FIG. 20 is a plan view for explaining the semiconductor device according to some exemplary embodiments of the present disclosure. For convenience of explanation, differences from those described with reference to FIG. 1 to FIG. 5 will be mainly described.

Referring to FIG. 20, the semiconductor device according to some exemplary embodiments of the present disclosure may further include a third fin type pattern 310, and a fifth gate structure 515.

The substrate 100 may further include a fourth region R4. The fourth region R4 may be spaced apart from the first region R1. The third region R3 may be interposed between the first region R1 and the fourth region R4. The first region R1 and the fourth region R4 may be spaced apart from each other in the first direction X with the third region R3 interposed therebetween.

The peripheral circuit formed in the fourth region R4 may be a circuit that operates the memory cells formed in the first region R1. For example, in the fourth region R4, peripheral circuit transistors electrically connected to the memory cell transistors of the first region R1 may be formed. In order to prevent the transistors of the first region R1 and the fourth region R4 from being interfered with each other when the transistors of the first region R1 and the fourth region R4 are driven, a third region R3 which is a buffer region may be interposed between the first region R1 and the fourth region R4.

A plurality of third fin type patterns 310 may be disposed on the substrate 100 of the fourth region R4. The third fin type pattern 310 may extend long along the first direction X. The third fin type pattern 310 may include a long side extending in the first direction X, and a short side extending in the second direction Y.

In the semiconductor device according to some exemplary embodiments of the present disclosure, the separated distance P1 of the first tin type patterns 110 may be different from the separated distance P2 of the third fin type patterns 310. For example, the separated distance P2 of the third fin type patterns 310 may be larger than the separated distance P1 of the first fin type patterns 110.

A fifth gate structure 515 may be formed on the substrate 100 of the fourth region R4. The fifth gate structure 515 may be formed to intersect with the third fin type pattern 310 on the third fin type pattern 310.

By way of summation and review, exemplary embodiments of the present disclosure provide a semiconductor device capable of reducing overhead of a chip area, while securing drive characteristics of transistors formed in different regions. That is, gate structures of the cell area and the peripheral area may be aligned, e.g., so all gate structures may be manufactured simultaneously, with an insulating structure between the cell and peripheral areas that intersects the gate structures and separates the cell and peripheral areas. The gate structures of both the cell and peripheral areas abut, e.g., contact, the insulating structure, so a buffer area, e.g., interface area, separating the cell and peripheral areas may be reduced, e.g., an area required for gate closing may be eliminated and an empty space between the cell and peripheral areas may be substantially reduced or completely eliminated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region, a second region, and a buffer region between the first region and the second region, the first region being a SRAM cell region, and the second region being a first peripheral circuit region to operate the SRAM cell region;
a plurality of first gate structures extending long in a first direction on the first region of the substrate, the plurality of first gate structures being spaced apart from each other in a second direction different from the first direction;
a plurality of second gate structures extending long in the first direction on the second region of the substrate, the plurality of second gate structures being spaced apart from each other in the second direction, and each one of the plurality of second gate structures being aligned with a corresponding one of the plurality of first gate structures in a row along the first direction;
a first insulating structure extending in the second direction on the buffer region of the substrate, the first insulating structure extending between the first region and the second region along an entire length of each of the first and second regions in the second direction; and
a second insulating structure on the first region of the substrate, the second insulating structure being in contact with a part of the plurality of first gate structures,
wherein an upper surface of the first insulating structure is at a same plane as an upper surface of the second insulating structure,
wherein the substrate further includes a third region having a second peripheral circuit to operate the SRAM cell region,
wherein the first region and the second region are spaced apart from each other in the first direction with the buffer region therebetween, and the first region and the third region are spaced apart from each other in the second direction with the buffer region therebetween, and
wherein the semiconductor device further includes:
a plurality of first fin type patterns extending in the second direction and spaced apart by a first distance in the first direction, on the first region of the substrate, and
a plurality of second fin type patterns extending in the second direction and spaced apart by a second distance greater than the first distance in the first direction, on the third region of the substrate.

2. The semiconductor device as claimed in claim 1, wherein the first insulating structure is in contact with the plurality of first gate structures and the plurality of second gate structures.

3. The semiconductor device as claimed in claim 2, wherein a number of first gate structures of the plurality of first gate structures in contact with the first insulating structure is larger than a number of first gate structures of the plurality of first gate structures in contact with the second insulating structure.

4. The semiconductor device as claimed in claim 1, wherein a width of the first insulating structure in the first direction is larger than a width of the second insulating structure in the first direction.

5. The semiconductor device as claimed in claim 1, further comprising a third insulating structure on the second region of the substrate, the third insulating structure being in contact with a part of the plurality of second gate structures, and a width of the first insulating structure in the first direction being greater than or equal to a width of the third insulating structure in the first direction.

6. The semiconductor device as claimed in claim 1, wherein:
the plurality of first fin type patterns are defined by a first trench of a first depth, and
the plurality of second fin type patterns are defined by a second trench of a second depth, the first region and the second region being defined by a deep trench of a third depth deeper than the first depth and the second depth.

7. The semiconductor device as claimed in claim 1, further comprising an interlayer insulating film on the substrate, an upper surface of the interlayer insulating film being placed on a same plane as upper surfaces of the plurality of first gate structures and upper surfaces of the plurality of second gate structures.

8. The semiconductor device as claimed in claim 7, wherein:
each of the plurality of first gate structures includes a first gate electrode, and each of the plurality of second gate structures includes a second gate electrode, and
an upper surface of each first gate electrode and an upper surface of each second gate electrode is placed on the same plane as the upper surface of the interlayer insulating film.

9. A semiconductor device, comprising:
a substrate including a first region, a second region, and a buffer region between the first region and the second region;
a first gate structure on the first region of the substrate, the first gate structure including a first long side in a first direction, and a first short side in a second direction different from the first direction;
a second gate structure on the second region of the substrate, the second gate structure including a second long side in the first direction and a second short side in the second direction, the second short side facing the first short side;
a first insulating structure on the buffer region of the substrate between the first short side of the first gate structure and the second short side of the second gate structure; and
a second insulating structure on the first region of the substrate,
wherein the first gate structure is between the first insulating structure and the second insulating structure, a width of the first insulating structure in the first direction being different from a width of the second insulating structure in the first direction, wherein an upper surface of the first insulating structure is at a same plane as an upper surface of the second insulating structure, and wherein the first gate structure includes a gate spacer defining a gate trench, and a high dielectric constant insulating film extending along sidewalls and a bottom surface of the gate trench, sidewalls of the first insulating structure, and sidewalls of the second insulating structure.

10. The semiconductor device as claimed in claim 9, wherein the width of the first insulating structure in the first direction is greater than the width of the second insulating structure in the first direction.

11. The semiconductor device as claimed in claim 9, wherein a width of the first insulating structure in the second direction is greater than a width of the second insulating structure in the second direction.

12. The semiconductor device as claimed in claim 9, wherein:

the first gate structure includes a gate electrode on the high dielectric constant insulating film, and the gate electrode is not in contact with the first insulating structure and the second insulating structure.

13. A semiconductor device, comprising:

a deep trench of a first depth defining a first region and a second region spaced apart from each other;

a first trench which defines a first fin type pattern extending in a first direction in the first region and has a second depth shallower than the first depth;

a second trench which defines a second fin type pattern extending in the first direction in the second region and has a third depth shallower than the first depth;

a field insulating film which fills a part of the deep trench, a part of the first trench, and a part of the second trench;

a first insulating structure having a first width in a second direction different from the first direction, on the field insulating film filling the deep trench;

a second insulating structure having a second width different from the first width in the second direction, on the field insulating film filling the first trench;

a third insulating structure having a third width in the second direction, on the field insulating film filling the second trench;

a first gate structure intersecting with the first fin type pattern and extending in the second direction between the first insulating structure and the second insulating structure; and a second gate structure extending in the second direction and intersecting with the second fin type pattern, wherein an upper surface of the first insulating structure is at a same plane as an upper surface of the second insulating structure, and wherein the second gate structure is between the first insulating structure and the third insulating structure, and the third width is equal to or smaller than the first width.

14. The semiconductor device as claimed in claim 13, wherein a width of the first insulating structure in the second direction is greater than a width of the second insulating structure in the second direction.

* * * * *